(12) United States Patent
Choi et al.

(10) Patent No.: US 9,620,744 B2
(45) Date of Patent: Apr. 11, 2017

(54) OPTICAL PATTERNING MASK AND METHOD FOR FABRICATING DISPLAY DEVICE USING THE SAME

(71) Applicant: Samsung Display Co., Ltd., Yongin (KR)

(72) Inventors: Jin Baek Choi, Anyang-si (KR); Yeon Hwa Lee, Yongin (KR); Joon Gu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/680,054

(22) Filed: Apr. 6, 2015

(65) Prior Publication Data

US 2016/0118630 A1 Apr. 28, 2016

(30) Foreign Application Priority Data

Oct. 27, 2014 (KR) .......................... 10-2014-0146240

(51) Int. Cl.
| | |
|---|---|
| *H01L 51/56* | (2006.01) |
| *H01L 51/00* | (2006.01) |
| *B41M 5/40* | (2006.01) |
| *B41M 5/46* | (2006.01) |
| *B41M 5/42* | (2006.01) |
| *B41M 5/48* | (2006.01) |

(52) U.S. Cl.
CPC .............. *H01L 51/56* (2013.01); *B41M 5/40* (2013.01); *B41M 5/42* (2013.01); *B41M 5/426* (2013.01); *B41M 5/46* (2013.01); *B41M 5/48* (2013.01); *H01L 51/0013* (2013.01)

(58) Field of Classification Search
CPC ..... G03F 1/48; G03F 1/50; G03F 1/54; H01L 51/0013; B41M 5/40; B41M 5/42; B41M 5/426; B41M 5/46; B41M 5/48
USPC ............................ 430/5, 199, 200, 201, 321
See application file for complete search history.

(56) References Cited

U.S. PATENT DOCUMENTS

| 8,153,201 B2 | 4/2012 | Aoyama et al. | |
|---|---|---|---|
| 2009/0197017 A1* | 8/2009 | Tanaka | H01L 51/0013 427/596 |
| 2010/0015424 A1* | 1/2010 | Seo | H01L 51/0013 428/216 |

(Continued)

FOREIGN PATENT DOCUMENTS

| KR | 10-2005-0052303 | 6/2005 |
|---|---|---|
| KR | 10-2005-0052648 | 6/2005 |
| KR | 10-2009-0041314 | 4/2009 |

*Primary Examiner* — John A McPherson
(74) *Attorney, Agent, or Firm* — H.C. Park & Associates, PLC

(57) ABSTRACT

The optical patterning mask had a protection layer on a light absorption layer. It prevents the light absorption layer from damaged by the cleaning gas when processing the used optical patterning mask for reuse. The protection layer may be made of the same material as bank layer or of material different from the bank layer. The bank layer defines the boundary of the area to be transferred in the transfer layer. The protection layer of the present invention can maintain longer the transfer efficiency of the optical patterning mask, even when the same mask is used repeatedly after cleaning, since the light absorption layer protected from cleaning process can maintain longer its heat conversion property.

16 Claims, 13 Drawing Sheets

(56) References Cited

U.S. PATENT DOCUMENTS

2012/0012883 A1\* 1/2012 Aoyama ............ H01L 51/0013
257/98

\* cited by examiner

OPTICAL PATTERNING MASK AND METHOD FOR FABRICATING DISPLAY DEVICE USING THE SAME

CROSS-REFERENCE TO RELATED APPLICATIONS

This application claims priority from Korean Patent Application No. 10-2014-0146240, filed on Oct. 27, 2014 with the Korean Intellectual Property Office, the disclosure of which is incorporated herein in its entirety by reference.

BACKGROUND

1. Field

The present invention relates to an optical patterning mask and a method for fabricating a display device using the same.

2. Description of Background

Among display devices, an organic light emitting display device is a self-luminous display device that has the advantages of wide viewing angle, superior contrast, and high response speed, and thus has been noticed as the next-generation display device.

An organic light emitting display device has an organic light emitting layer that is made of an organic light emitting material disposed between an anode electrode and a cathode electrode. If an anode voltage and a cathode voltage are applied to these electrodes, respectively, holes injected from the anode electrode move to the organic light emitting layer through a hole injection layer and a hole transport layer, and electrons move from the cathode electrode to the organic light emitting layer through an electron injection layer and an electron transport layer. In the organic light emitting layer, the electrons and the holes are recombined. Through this recombination, excitons are generated. As the excitons change from an excited state to a ground state, the organic light emitting layer emits light to display an image.

Typically, in fabricating an organic light emitting display device, the hole injection layer, the hole transport layer, the organic light emitting layer, the electron transport layer, and the electron injection layer are formed using an ink jet printing method, a nozzle print method, a deposition method using a metal mask, or a transfer method using heat or laser.

SUMMARY

On the other hand, the transfer method using heat or laser is a method for forming a pattern layer by transferring a transfer material of a transfer layer to a specific device substrate through irradiation of heat or laser onto an optical patterning mask that includes a base substrate, a reflective layer, a thermal insulation layer, a light absorption layer, a bank layer, and a transfer layer. Through the method, for example, an organic light emitting material of an organic light emitting material layer that is provided to the transfer layer of the optical patterning mask is transferred onto the substrate of the organic light emitting display device to form the organic light emitting layer.

After forming the pattern layer, the optical patterning mask is cleaned to remove the transfer material remaining on the optical patterning mask by injecting thermal energy or $O_2$ gas energy. Then, the optical patterning mask cleaned from the remaining transfer material can be reused.

However, when cleaning the transfer material remaining on the optical patterning mask by injecting $O_2$ gas energy, the light absorption layer may react on $O_2$ gas and be damaged because it is exposed bare after the transfer material is transferred from the optical patterning mask. Damaged light absorption layer may deteriorate the function of the light absorption layer that converts light into heat. This may deteriorate the transfer efficiency of the transfer material.

Accordingly, the present invention is to provide an optical patterning mask that may prevent the damage on the light absorption layer and reduce the chance of deteriorating transfer efficiency of a transfer material.

The present invention is also to provide a method for fabricating a display device using an optical patterning mask, which can reduce deterioration of the transfer efficiency of a transfer material through preventing a light absorption layer from being damaged and preventing the function of the light absorption layer from deteriorating.

Additional advantages, subjects, and features of the invention will be set forth in part in the description which follows and in part will become apparent to those having ordinary skill in the art upon examination of the following or may be learned from practice of the invention.

In one aspect of the present invention, there is provided an optical patterning mask comprising: a base substrate; a reflective layer formed on the base substrate and including an opening; a thermal insulation layer formed on the reflective layer to cover the opening; a light absorption layer formed on the thermal insulation layer; a protection layer formed in a position that overlaps the opening on the light absorption layer; a bank layer formed on the light absorption layer to expose the protection layer; and a transfer layer formed on the protection layer and the bank layer, wherein a thickness of the protection layer is thinner than a thickness of the bank layer.

The protection layer and the bank layer may be integrally formed.

The bank layer and the protection layer may be formed of an inorganic material.

A portion of the transfer layer that overlaps the opening may be flat.

The transfer layer may comprise a transfer inclination portion having an inclination shape in a portion that overlaps an edge portion of the opening.

The thermal insulation layer may comprise a groove that is formed in a region that overlaps the opening of an upper surface that comes in contact with the light absorption layer.

The optical patterning mask may further comprise a tapered layer arranged between the thermal insulation layer and the light absorption layer, wherein the tapered layer may include a tapered inclination portion formed to expose a portion of the thermal insulation layer that overlaps the opening and having an inclination shape in the portion that overlaps an edge portion of the opening.

In another aspect of the present invention, there is provided an optical patterning mask comprising: a base substrate; a reflective layer formed on the base substrate and including an opening; a thermal insulation layer formed on the reflective layer to cover the opening; a light absorption layer formed on the thermal insulation layer; a protection layer formed on the light absorption layer; a bank layer formed on the protection layer so that a portion of the protection layer that overlaps the opening is exposed; and a transfer layer formed on a region of the protection layer that overlaps the opening and the bank layer, wherein a thickness of the protection layer is thinner than a thickness of the bank layer.

The protection layer and the bank layer may be formed of different materials.

An etching rate of the protection layer and an etching rate of the bank layer may be different from each other.

The bank layer and the protection layer may be formed of an inorganic material.

A region of the transfer layer that overlaps the opening may be flat.

The transfer layer may comprise a transfer inclination portion having an inclination shape in a portion that overlaps an edge portion of the opening.

The thermal insulation layer may comprise a groove that is formed in a region that overlaps the opening of an upper surface that comes in contact with the light absorption layer.

The optical patterning mask may further comprise a tapered layer arranged between the thermal insulation layer and the light absorption layer, wherein the tapered layer may include a tapered inclination portion formed to expose a portion of the thermal insulation layer that overlaps the opening and having an inclination shape in the portion that overlaps an edge portion of the opening.

In still another aspect of the present invention, there is provided a method for fabricating a display device, comprising: a preparing an optical patterning mask including a base substrate, a reflective layer formed on the base substrate and including an opening, a thermal insulation layer formed on the reflective layer to cover the opening, a light absorption layer formed on the thermal insulation layer, a protection layer formed in a position that overlaps the opening on the light absorption layer, a bank layer formed on the light absorption layer to expose the protection layer, and a transfer layer formed on the protection layer and the bank layer, wherein a thickness of the protection layer is thinner than a thickness of the bank layer; arranging the substrate on an upper portion of the optical patterning mask so that the transfer layer faces a first electrode of a substrate of the display device; forming an organic material layer by transferring a transfer material of the transfer layer, which is positioned on the light absorption layer and the protection layer that overlaps the opening of the reflective layer, to the first electrode of the substrate through irradiating a lower portion of the base substrate with light; and removing the residual transfer material of the transfer layer that remains on the bank layer.

The transfer layer may comprise at least one organic material selected from the group including an organic light emitting layer (EML), an organic hole injection layer (HIL), an organic hole transport layer (HTL), an organic electron injection layer (EIL), and an organic electron transport layer (ETL) of an organic light emitting display device.

The removing the residual transfer material may be performed by injecting $O_2$ gas energy into an upper portion of the bank layer.

The bank layer and the protection layer may be formed of an inorganic material.

According to embodiments of the present invention, at least the following effects can be achieved.

Since the optical patterning mask according to an embodiment of the present invention includes the protection layer that is formed on the light absorption layer that overlaps the opening of the reflective layer, an asher, for example, $O_2$ gas, which is used to remove the residual transfer material of the transfer layer that remains on the bank layer after the transfer process using the optical patterning mask, can be prevented from coming in contact with and reacting on a part of the light absorption layer that is exposed from the optical patterning mask.

Through this, the light absorption layer can be prevented from reacting on the asher that is used to remove the residual transfer material of the transfer layer that remains on the bank layer. Accordingly, the light absorption layer can be prevented from being damaged, and the function of the light absorption layer can be prevented from deteriorating.

Further, in the case of reusing the optical patterning mask, from which the remaining transfer material of the transfer layer has been removed, deterioration of the transfer efficiency of the transfer material can be reduced.

The effects according to the present invention are not limited to the contents as exemplified above, but further various effects are included in the description.

BRIEF DESCRIPTION OF THE DRAWINGS

The above and other objects, features and advantages of the present invention will be more apparent from the following detailed description taken in conjunction with the accompanying drawings.

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the accompanying drawings.

Figure 1:
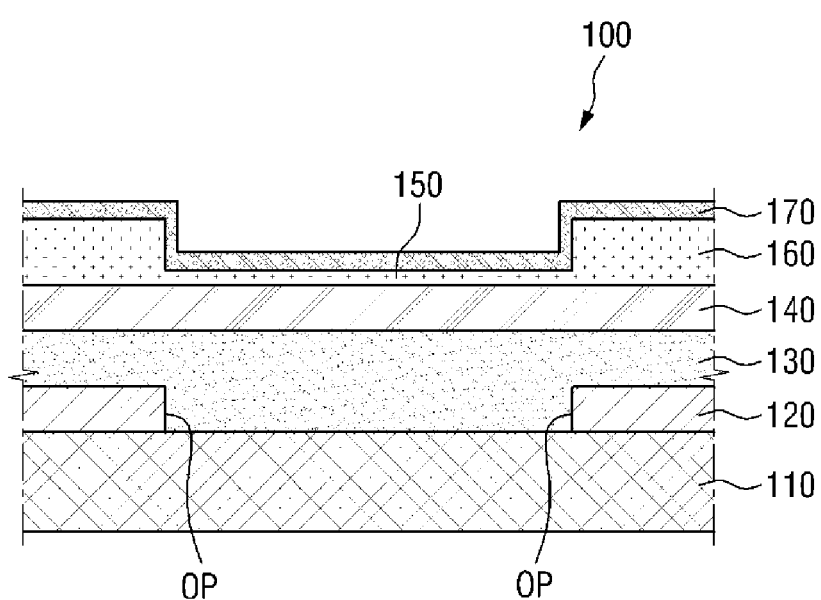
FIG. 1 is a cross-sectional view of an optical patterning mask according to an embodiment of the present invention.
Figure 2:
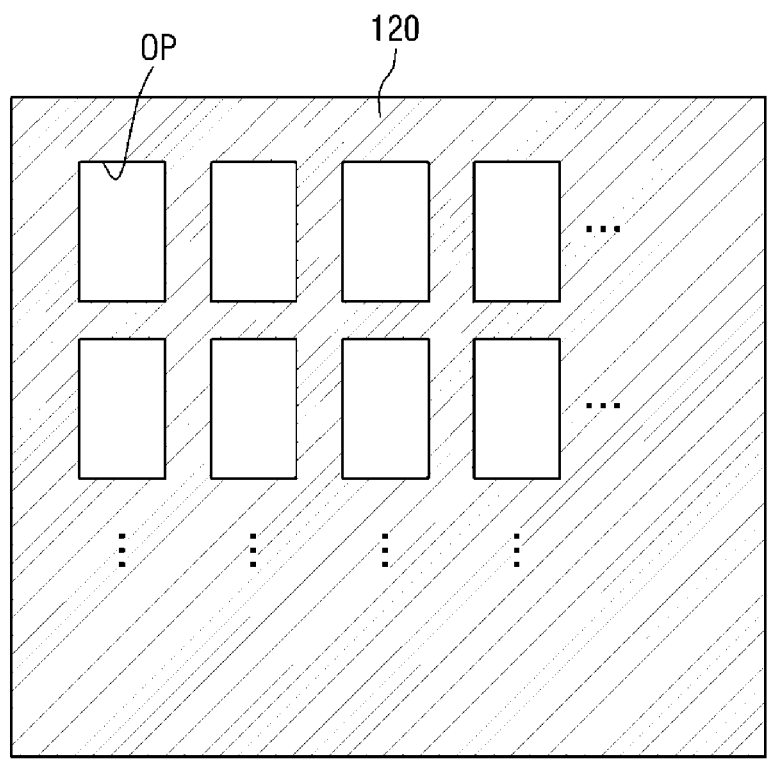
FIG. 2 is a plan view of a reflective layer of FIG. 1.

FIG. 1 is a cross-sectional view of an optical patterning mask according to an embodiment of the present invention, and FIG. 2 is a plan view of a reflective layer of FIG. 1.

Referring to FIG. 1, an optical patterning mask 100 according to an embodiment of the present invention includes a base substrate 110, a reflective layer 120, a thermal insulation layer 130, a light absorption layer 140, a protection layer 150, a bank layer 160, and a transfer layer 170.

The base substrate 110 may be a light permeable substrate that can transmit lamp light or laser light. For example, the base substrate 110 may be a glass substrate, a quartz substrate, or a synthetic resin substrate that is composed of a transparent polymer material, such as, polyester, poly acrylic, poly epoxy, polyethylene, polystyrene, or polyethylene terephthalate, having superior light permeability. The lamp light or laser light that has passed through the base substrate 110 may reach the light absorption layer 140 to generate heat in the light absorption layer 140.

The reflective layer 120 is formed on the base substrate 110, and includes at least one opening OP as illustrated in FIG. 2. The reflective layer 120 may selectively provide the lamp light or the laser light that has passed through the base substrate 110 to a part of the light absorption layer 140 through the opening OP. The part of the light absorption layer 140 may be a portion that corresponds to a pattern layer that is formed through transferring a transfer material of the transfer layer 170 to a specific substrate using the optical patterning mask 100. A reflective region of the reflective layer 120 except for the opening OP reflects the lamp light or the laser light that penetrates the base substrate 110 in the direction of the base substrate 110.

The reflective layer 120 may include a material having high reflectivity with respect to the lamp light or the laser light. Exemplary material could be selected from the group including aluminum, silver, platinum, copper, an alloy including aluminum, an alloy including silver, and indium oxide-tin oxide. The reflective layer 120 may be formed by depositing the above-described material using sputtering, electron beam deposition, or vacuum deposition and patterning the deposited material.

The thermal insulation layer 130 is formed on the reflective layer 120 to cover the opening OP. The upper surface of the thermal insulating layer 130, contacting with the light absorption layer 140, may be flat. If a part of the light that is reflected by the reflective layer 120 is converted into heat and remains in the reflective layer 120, the thermal insulation layer 130 prevents such heat from transferring to the light absorption layer 140. Further, the light that has passed through the opening OP is converted into heat in the light absorption layer 140, and the thermal isolation layer 130 intercepts the heat that is transferred in the direction of the base substrate 110. For this, the thermal insulation layer 130 is formed of a material of low thermal conductivity. However, in order to pass the light that is provided through the opening OP of the reflective layer 120, the thermal insulation layer 130 should be formed of a material having permeability. For example, the thermal insulation layer 130 may be made of any one of titanium oxide, silicon oxide, silicon nitride, silicon oxynitride, zirconium oxide, silicon carbide, and organic polymer, but is not limited thereto. The thermal insulation layer 130 may be formed by depositing the above-described material using the sputtering, the electron beam deposition, or the vacuum deposition.

The light absorption layer 140 is formed on the thermal insulation layer 130. The light absorption layer 140 may be a light-heat conversion layer which absorbs and converts the light into heat that has passed through the base substrate 110, the opening OP of the reflective layer 120, and the thermal insulation layer 130. The light absorption layer 140 may sublime and transfer the transfer material of the transfer layer 170 formed on the thermal absorption layer 140 by heat to the specific substrate to form the pattern layer. In this case, a portion of the transfer layer 170 that overlaps the bank layer 160 is not sublimed.

The light absorption layer 140 may be formed of a material having low light reflectivity and high light absorbability. For example, the light absorption layer 140 may be formed of molybdenum (Mo), chromium (Cr), titanium (Ti), tin (Sn), tungsten (W), or an alloy thereof, but is not limited thereto. The light absorption layer 140 may be formed by depositing the above-described material using the sputtering, electron beam deposition, or the vacuum deposition.

The protection layer 150 is formed on the light absorption layer 140, and is formed in a position that overlaps the opening OP of the reflective layer 120. The protection layer 150 can prevent an asher, for example, $O_2$ gas, from contacting with and reacting on a part of the light absorption layer 140 that is exposed after the transfer process of the optical patterning mask 100. The asher gas is used to remove the residual transfer material of the transfer layer 170 remaining on the bank layer 160 after the transfer process. Since the light absorption layer 140 is formed to include a metal material, it may be damaged through oxidization reaction when it comes in contact with the $O_2$ gas. This may deteriorate the function of the light absorption layer 140. The protection layer 150 can prevent the light absorption layer 140 from coming in contact with the $O_2$ gas. Accordingly, the protection layer 150 can prevent the light absorption layer 140 from being damaged, and thus can prevent deterioration of the light absorption layer 140. Accordingly, when performing the transfer process using the cleaned optical patterning mask 100, the protection layer 150 can keep the transfer efficiency of the transfer material longer.

The protection layer 150 may be formed of the same material as the material of the bank layer 160 to be described later. The protection layer 150 may be formed of an inorganic material that does not react on the asher, for example, $O_2$ gas. For example, the protection layer 150 may be formed of at least one of silicon oxide, gallium oxide, aluminum oxide, zinc oxide, indium tin oxide, tin oxide, tungsten oxide, molybdenum oxide, chrome oxide, silicon nitride, aluminum nitride, and gallium nitride.

On the other hand, the protection layer 150 can protect the light absorption layer 140 when the transfer material of the transfer layer 170 that remains on the bank layer 160 is removed after the transfer process of the optical patterning mask 100. Further, the protection layer 150 is formed thinner than the bank layer 160 so that the heat of the light absorption layer 140 can be smoothly transferred to the transfer layer 170 during the transfer process of the optical patterning mask 100. For example, the bank layer 160 may be about 1 μm or more thick, and the protection layer 150 may be about 7 nm to 50 nm thick.

The protection layer 150 may be integrally formed with the bank layer 160 when the bank layer 160 is formed. The protection layer 150 and the bank layer 160 may be formed through a photolithography process. In this case, a dry etching process may be selected as an etching process of the photolithography to make the protection layer 150 thinner than the bank layer 160.

The bank layer 160 is formed on the light absorption layer 140 to expose the protection layer 150, specifically, an upper surface of the protection layer 150. That is, the bank layer 160 is formed on the reflective layer 120 except for the opening OP. The bank layer 160 may serve as a fence preventing the transfer material of the transfer layer 170 from being deposited on another region except for a determined position when transferring the transfer material of the transfer layer 170 by subliming it through heat of the light absorption layer 140. In this case, the transfer layer 170 formed on the bank layer 160 is not sublimed.

The bank layer 160 may be formed of at least one of silicon oxide, gallium oxide, aluminum oxide, zinc oxide, indium tin oxide, tin oxide, tungsten oxide, molybdenum oxide, chrome oxide, silicon nitride, aluminum nitride, and gallium nitride.

The transfer layer 170 is formed on the protection layer 150 and the bank layer 160. The transfer layer 170 is sublimed and transferred to the specific substrate by the heat of the light absorption layer 140 that is transferred through the protection layer 150, but the portion that is formed on the bank layer 160 is not transferred to the specific substrate. Here, the portion of the transfer layer 170 that overlaps the opening OP of the reflective layer 120 may be flat.

The transfer layer 170 is formed of a transfer material that includes the material of the pattern layer of the specific substrate. The transfer layer 170 may include an organic material of an organic material layer included in the organic light emitting display device that is a kind of display device, and for example, the transfer layer 170 may include any one of an organic light emitting layer (EML), an organic hole injection layer (HIL), an organic hole transport layer (HTL), an organic electron injection layer (EIL), and an organic electron transport layer (ETL).

The transfer layer 170 may be formed using a wet method, such as a spin coating method, a spray coating method, an ink jet printing method, a nozzle printing method, a deep coating method, a die coating method, a roll coating method, a blade coating method, a bar coating method, or a gravure coating method. Further, the transfer layer 170 may be formed using vacuum deposition or sputtering.

The optical patterning mask 100 described above includes the protection layer 150 that is formed on the light absorption layer 140 that overlaps the opening OP of the reflective layer 120. This prevents the asher gas used to remove the residual transfer material of the transfer layer 170 remaining on the bank layer 160 after the transfer process from contacting with and reacting on a part of the light absorption layer 140 that is exposed from the optical patterning mask 100.

This can prevent the light absorption layer 140 from being damaged, which reduces deterioration of the light absorption layer 140.

Further, when reusing the optical patterning mask 100 after removing the remaining transfer material of the transfer layer 170, this can reduce deterioration of the transfer efficiency of the transfer material.

Figure 3:
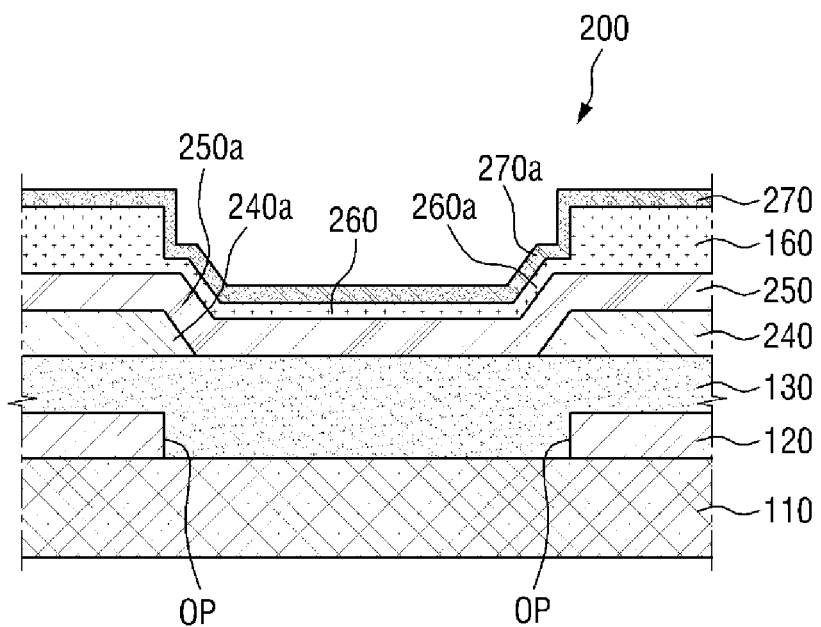
FIG. 3 is a cross-sectional view of an optical patterning mask according to another embodiment of the present invention.

FIG. 3 is a cross-sectional view of an optical patterning mask according to another embodiment of the present invention.

Referring to FIG. 3, an optical patterning mask 200 according to another embodiment of the present invention includes a base substrate 110, a reflective layer 120 including an opening OP, a thermal insulation layer 130, a tapered layer 240, a light absorption layer 250, a protection layer 260, a bank layer 160, and a transfer layer 270.

The optical patterning mask 200 according to another embodiment of the present invention is similar to the optical patterning mask 100 of FIG. 1 except that the tapered layer 240 is included, and the light absorption layer 250, the protection layer 260, and the transfer layer 270 are different to have tapered portion and inclination layers. Accordingly, explanation of the optical patterning mask 200 according to another embodiment of the present invention will be made around the tapered layer 240, the light absorption layer 250, the protection layer 260, and the transfer layer 270.

The tapered layer 240 is arranged between the thermal insulation layer 130 and the light absorption layer 250, and is formed to expose a portion of the thermal insulation layer 130 that overlaps the opening OP of the reflective layer 120. The tapered layer 240 includes a tapered inclination portion 240a having an inclination shape in a portion that overlaps an edge portion of the opening OP. The tapered inclination portion 240a has an inclination shape in a portion of the transfer layer 270 that overlaps the edge portion of the opening OP.

The tapered portion 240 may be formed of an inorganic material such as silicon oxide or an organic material such as polyimide. The tapered layer 240 may be formed through a photolithography process.

The light absorption layer 250 is similar to the light absorption layer 140 of FIG. 1. However, the light absorption layer 250 includes an absorption inclination portion 250a having an inclination shape in a portion that overlaps the edge portion of the opening OP by the tapered inclination portion 240a of the tapered layer 240.

The protection layer 260 is similar to the protection layer 150 of FIG. 1. However, the protection layer 260 includes a protection inclination portion 260a having an inclination shape in a portion that overlaps the edge portion of the opening OP by the absorption inclination portion 250a of the light absorption layer 250.

The transfer layer 270 is similar to the transfer layer 170 of FIG. 1. However, the transfer layer 270 includes a transfer inclination portion 270a having an inclination shape in a portion that overlaps the edge portion of the opening OP by the protection inclination portion 260a of the protection layer 260.

The transfer material of the transfer inclination portion 270a may be heated and sublimed by heat of the absorption inclination portion 250a. In this case, the transfer material of the transfer inclination portion 270a is sublimed in a vertical direction from the transfer inclination portion 270a that is inclined to a flat portion (a portion that is at the lowest position) of the transfer layer 270 that overlaps the opening OP of the reflective layer 120, and is deposited on a region of the specific substrate on which the pattern layer is to be formed in a convex Gaussian shape. Accordingly, the transfer material of the transfer inclination portion 270a allows a pattern layer which may have a non-uniform thickness to be flat and to have uniform thickness, since the transfer material of the flat portion of the transfer layer 270 is sublimed in a vertical direction from the flat portion of the transfer layer 270 and is deposited on the region of the specific substrate on which the pattern layer is to be formed in a state where the center portion thereof is in the convex Gaussian shape. That is, an edge portion having a thin thickness in a portion formed by transferring the flat portion posited at the lowest position in the transfer layer 270 overlaps with an edge portion having a thin thickness in a portion formed by transferring the transfer inclination portion 270a in the transfer portion 270, so that the pattern layer formed by transferring the transfer layer 270 may have uniform thickness.

As described above, the optical patterning mask 200 according to another embodiment of the present invention includes the protection layer 260, and thus in the case of reusing the optical patterning mask 200 after removing the remaining transfer material of the transfer layer 270, deterioration of the transfer efficiency of the transfer material can be reduced.

Further, since the optical patterning mask 200 according to another embodiment of the present invention includes the tapered layer 240 having the tapered portion 240a, the transfer inclination portion 270a can be formed in the portion of the transfer layer 270 that overlaps the edge portion of the opening OP.

According to the optical patterning mask 200 according to another embodiment of the present invention, the transfer material of the transfer layer 270 that overlaps the opening OP is sublimed and transferred to the specific substrate, and thus the pattern layer can be formed in an entirely flat shape and with a uniform thickness.

Figure 4:
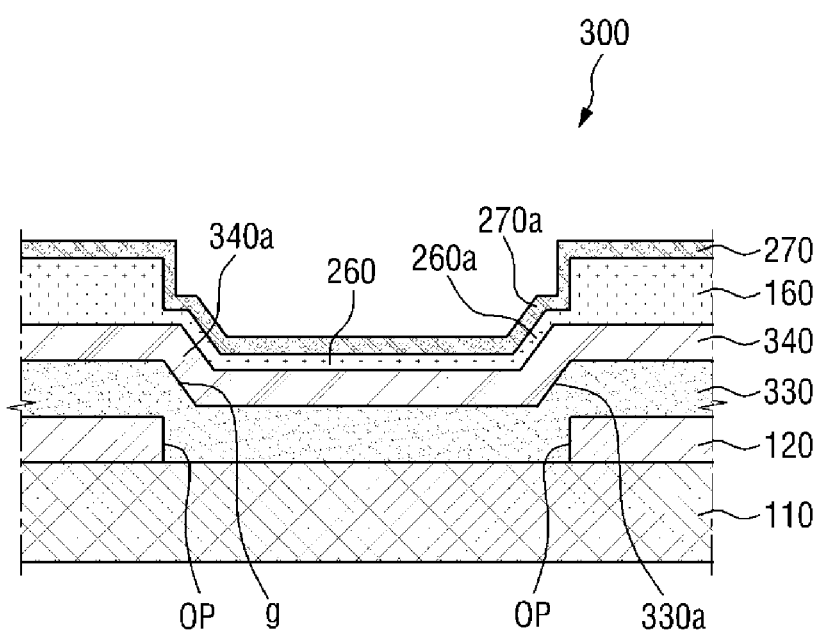
FIG. 4 is a cross-sectional view of an optical patterning mask according to still another embodiment of the present invention.

FIG. 4 is a cross-sectional view of an optical patterning mask according to still another embodiment of the present invention.

Referring to FIG. 4, an optical patterning mask 300 according to still another embodiment of the present invention includes a base substrate 110, a reflective layer 120 including an opening OP, a thermal insulation layer 330, a light absorption layer 340, a protection layer 260, a bank layer 160, and a transfer layer 270.

The optical patterning mask 300 according to still another embodiment of the present invention is similar to the optical patterning mask 200 of FIG. 3 except that the thermal insulation layer 330 and the light absorption layer 340 are different from those of the optical patterning mask 200 of FIG. 3. Accordingly, explanation of the optical patterning mask 300 will be made about the thermal insulation layer 330 and the light absorption layer 340.

The thermal insulation layer 330 is similar to the thermal insulation layer 130 of FIG. 3. However, the thermal insulation layer 330 includes a groove g that is formed in a region of the upper surface, which comes in contact with the light absorption layer 340 and overlaps the opening OP of the reflective layer 120. The cross-sectional shape of the groove g may be a reversed trapezoidal shape. Through the groove g, an inclination surface 330a having an inclination shape may be formed in a portion of the upper surface of the thermal insulation layer 330 that overlaps the opening OP.

The light absorption layer 340 is similar to the light absorption layer 250 of FIG. 3. However, the light absorption layer 340 includes an absorption inclination portion 340a having the inclination shape in the portion that overlaps the edge portion of the opening OP by the inclination surface 330a of the thermal insulation layer 330. Further, the light absorption layer 340 comes in contact with the whole upper surface of the thermal insulation layer 330.

As described above, the optical patterning mask 300 includes the protection layer 260, and thus when reusing the optical patterning mask 300 after removing the remaining transfer material of the transfer layer 270, deterioration of the transfer efficiency of the transfer material can be reduced.

Further, since the optical patterning mask 300 includes the light absorption layer 330 having the absorption inclination surface 330a, and thus the transfer inclination portion 270a can be formed in the portion of the transfer layer 270 that overlaps the edge portion of the opening OP.

According to the optical patterning mask 300, the transfer material of the transfer layer 270 that overlaps the opening OP is sublimed and transferred to the specific substrate, and thus the pattern layer can be formed in an entirely flat shape and with a uniform thickness.

Figure 5:
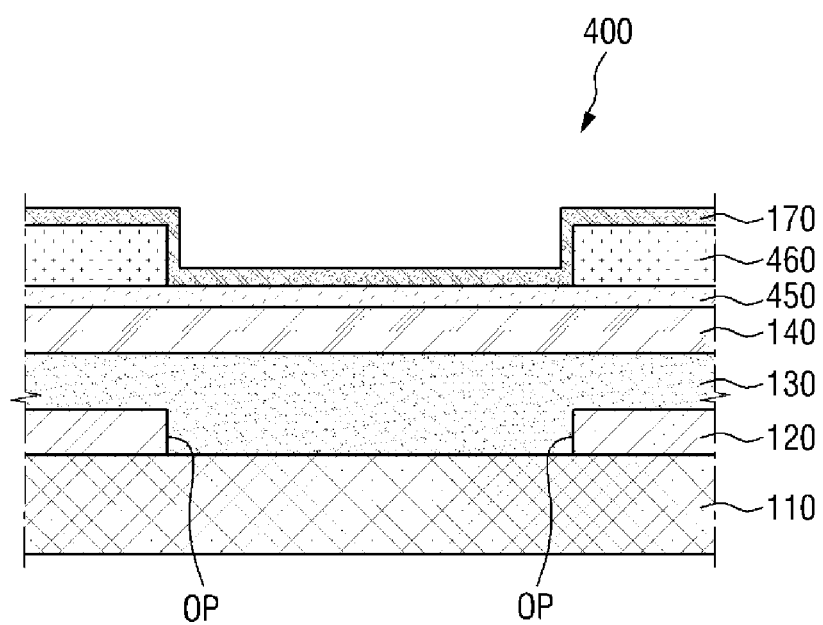
FIG. 5 is a cross-sectional view of an optical patterning mask according to still another embodiment of the present invention.

FIG. 5 is a cross-sectional view of an optical patterning mask according to still another embodiment of the present invention.

Referring to FIG. 5, an optical patterning mask includes a base substrate 110, a reflective layer 120 including an opening OP, a thermal insulation layer 130, a light absorption layer 140, a protection layer 450, a bank layer 460, and a transfer layer 170.

The optical patterning mask 400 according to still another embodiment of the present invention is similar to the optical patterning mask 100 of FIG. 1 except that the protection layer 450 and the bank layer 460 are different from those of the optical patterning mask 100 of FIG. 1. Accordingly, explanation of the optical patterning mask 400 will be made about the protection layer 450 and the bank layer 460.

The protection layer 450 is similar to the protection layer 150 of FIG. 1. However, the protection layer 450 is formed entirely on the light absorption layer 450. Further, the protection layer 450 is formed of a material that is different from the material of the bank layer 460 to be described later. That is, the protection layer 450 has an etching rate that is different from the etching rate of the bank layer 460. Accordingly, the bank layer 460 may be formed to expose a portion of the protection layer 450 that overlaps the opening OP of the reflective layer 120 by using a simple wet etching process in lieu of a dry etching process. The dry etching process has more complicated process conditions in the photolithography.

The protection layer 450 may be formed of a material having an etching rate that is different from the etching rate of the material that forms the bank layer 460. It may be formed of an inorganic material that does not react to the asher, for example, $O_2$ gas, used to remove the transfer material of the transfer layer 170 remaining on the bank layer 460. Exemplary material can be selected from the group including silicon oxide, gallium oxide, aluminum oxide, zinc oxide, indium tin oxide, tin oxide, tungsten oxide, molybdenum oxide, chrome oxide, silicon nitride, aluminum nitride, and gallium nitride. In this case, the protection layer 450 should be selected as a material that is not etched by the etching solution used to form the bank layer 460 and expose the portion of the protection layer 450 that overlaps the opening OP.

The bank layer 460 is similar to the bank layer 160 of FIG. 1. However, the bottom surface of the bank layer 460 comes in contact with the upper surface of the protection layer 450. The bank layer 460 may be formed of a material having an etching rate that is different from the etching rate of the material that forms the protection layer 450, and may be formed of any one selected from the group including silicon oxide, gallium oxide, aluminum oxide, zinc oxide, indium tin oxide, tin oxide, tungsten oxide, molybdenum oxide, chrome oxide, silicon nitride, aluminum nitride, and gallium nitride. In this case, the bank layer 460 should be formed of a material that can be etched by the etching solution used to expose the portion of the protection layer 450 that overlaps the opening OP of the reflective layer 120.

As described above, the optical patterning mask 400 includes the protection layer 450, and thus when reusing the optical patterning mask 400 after removing the remaining transfer material of the transfer layer 170, deterioration of the transfer efficiency of the transfer material can be reduced.

Further, the optical patterning mask 400 makes the protection layer 450 and the bank layer 460 out of different materials, which can simplify the manufacturing process of the bank layer 450.

Figure 6:
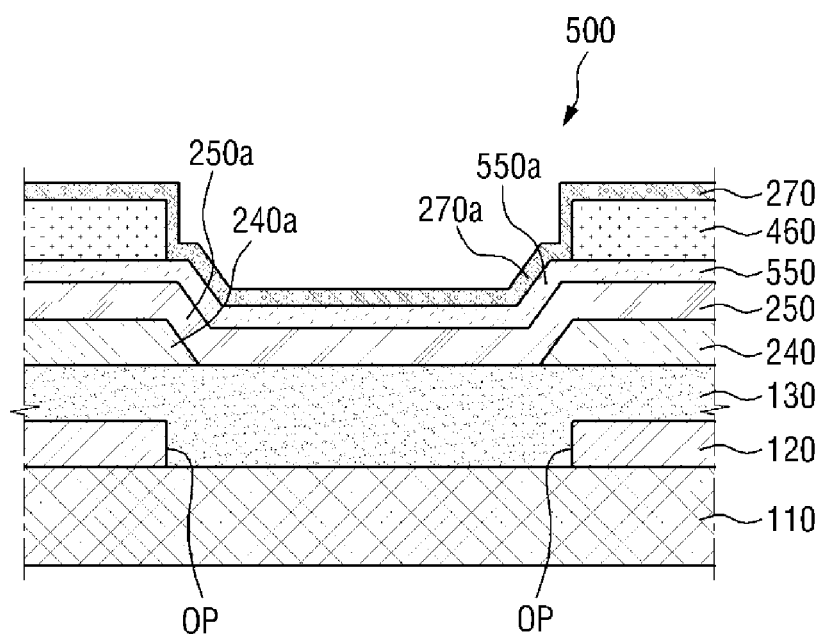
FIG. 6 is a cross-sectional view of an optical patterning mask according to still another embodiment of the present invention.

FIG. 6 is a cross-sectional view of an optical patterning mask 500 according to still another embodiment of the present invention.

Referring to FIG. 6, an optical patterning mask 500 includes a base substrate 110, a reflective layer 120 including an opening OP, a thermal insulation layer 130, a tapered layer 240, a light absorption layer 250, a protection layer 550, a bank layer 460, and a transfer layer 270.

The optical patterning mask 500 is similar to the optical patterning mask 400 of FIG. 5 except that the tapered layer 240 is included, and the light absorption layer 250, the protection layer 550, and the transfer layer 270 are different from those of the optical patterning mask 400 of FIG. 5. Accordingly, explanation of the optical patterning mask 500 will be made about the tapered layer 240, the light absorption layer 250, the protection layer 550, and the transfer layer 270.

Since the tapered layer 240 and the light absorption layer 250 have been described in detail with reference to FIG. 3, the duplicate explanation thereof will not be repeated.

The protection layer 550 is similar to the protection layer 450 of FIG. 5. However, the protection layer 550 includes a protection inclination portion 550*a* having an inclination shape in a portion that overlaps the edge portion of the opening OP by the absorption inclination portion 250*a* of the light absorption layer 250. Further, the protection layer 550 comes in contact with the whole upper surface of the light absorption layer 250.

Since the transfer layer 270 has been described in detail with reference to FIG. 3, the duplicate explanation thereof will be omitted.

As described above, the optical patterning mask 500 includes the protection layer 550. This may reduce deterioration of the transfer efficiency of the transfer material, when reusing the optical patterning mask 500 after removing the remaining transfer material of the transfer layer 270.

Further, the optical patterning mask 500 can simplify the process of manufacturing the bank layer 460 by forming the protection layer 550 and the bank layer 460 out of different materials.

Further, the optical patterning mask 500 including the tapered layer 540 with the tapered portion 240*a* can form the transfer inclination portion 270*a* in the portion of the transfer layer 270 that overlaps the edge portion of the opening OP.

According to the optical patterning mask 500, the transfer material of the transfer layer 270 that overlaps the opening OP is sublimed and transferred to the specific substrate, and thus the pattern layer can be formed in an entirely flat shape and with a uniform thickness.

Figure 7:
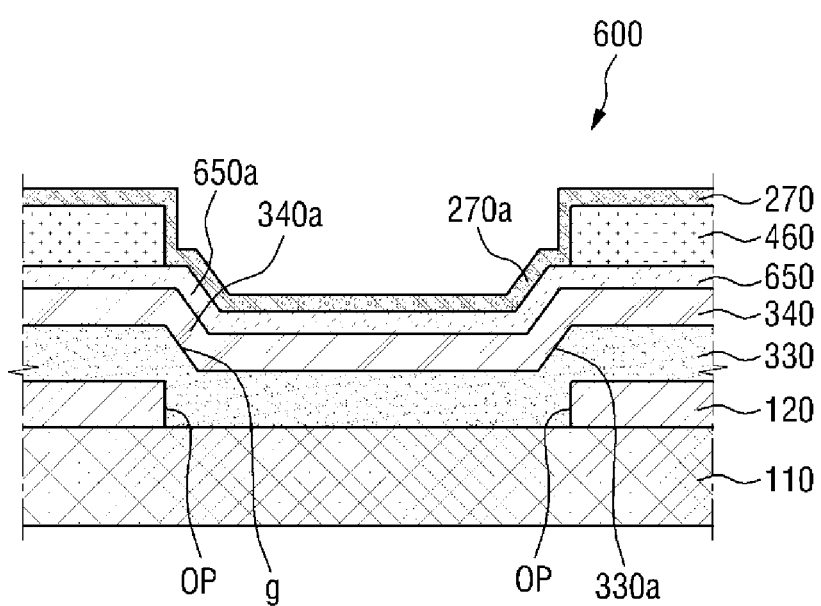
FIG. 7 is a cross-sectional view of an optical patterning mask according to still another embodiment of the present invention.

FIG. 7 is a cross-sectional view of an optical patterning mask according to still another embodiment of the present invention.

Referring to FIG. 7, an optical patterning mask 600 according to still another embodiment of the present invention includes a base substrate 110, a reflective layer 120 including an opening OP, a thermal insulation layer 330, a light absorption layer 340, a protection layer 650, a bank layer 460, and a transfer layer 270.

The optical patterning mask 600 is similar to the optical patterning mask 400 of FIG. 5 except that thermal insulation layer 330, the light absorption layer 340, the protection layer 650, and the transfer layer 270 are different from those of the optical patterning mask 400 of FIG. 5. Accordingly, explanation of the optical patterning mask 600 according to still another embodiment of the present invention will be made about the thermal insulation layer 330, the light absorption layer 340, the protection layer 650, and the transfer layer 270.

Since the thermal insulation layer 330 and the light absorption layer 340 have been described in detail with reference to FIG. 4, the duplicate explanation thereof will not be repeated.

The protection layer 650 is similar to the protection layer 450 of FIG. 5. However, the protection layer 650 includes a protection inclination portion 650*a* having an inclination shape in a portion that overlaps the edge portion of the opening OP by the inclination portion 340*a* of the light absorption layer 340. Further, the protection layer 650 comes in contact with the whole upper surface of the light absorption layer 350.

Since the transfer layer 270 has been described in detail with reference to FIG. 3, the duplicate explanation thereof will be omitted.

As described above, the optical patterning mask 600 includes the protection layer 650. This can reduce deterioration of the transfer efficiency of the transfer material when reusing the optical patterning mask 600 after removing the remaining transfer material of the transfer layer 270.

Further, the optical patterning mask 600 forms the protection layer 650 and the bank layer 460 out of different materials, which may simplify the manufacturing process of the bank layer 460.

Further, since the optical patterning mask 600 includes the light absorption layer 330 having the absorption inclination surface 330*a*, the transfer inclination portion 270*a* can be formed in the portion of the transfer layer 270 that overlaps the edge portion of the opening OP.

The optical patterning mask 600 can subline and transfer the transfer material of the transfer layer 270 that overlaps the opening OP to the specific substrate, and thus can form the pattern layer in an entirely flat shape and with a uniform thickness.

Hereinafter, an exemplary method for fabricating a display device using an optical patterning mask according to the embodiments of the present invention as described above will be described.

FIGS. 8 through 13 are cross-sectional views explaining a method for fabricating a display device using an optical patterning mask according to an embodiment of the present invention.

Figure 8:
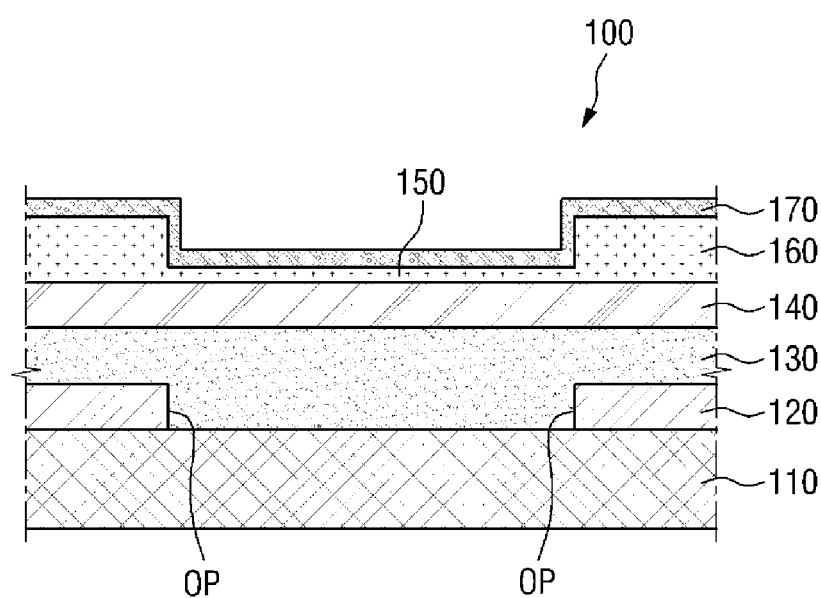
FIGS. 8 through 13 are cross-sectional views explaining a method for fabricating a display device using an optical patterning mask according to an embodiment of the present invention.

Referring to FIG. 8, an optical patterning mask 100 is prepared to include a base substrate 110, a reflective layer 120 formed on the base substrate 110 and including an opening OP, a thermal insulation layer 130 formed on the reflective layer 120 to cover the opening OP, a light absorption layer 140 formed on the thermal insulation layer 130, a protection layer 150 formed in a region that overlaps the opening OP on the light absorption layer 140, a bank layer 160 formed on the light absorption layer to expose the protection layer 150, and a transfer layer 170 formed on the protection layer 150 and the bank layer 160. The protection layer 150 is thinner than the bank layer 160. Since the optical patterning mask 100 has been described in detail, the duplicate explanation thereof will be omitted. FIG. 8 illustrates the optical patterning mask 100 of FIG. 1. However, optical patterning masks 200, 300, 400, 500, 600, and 700 as illustrated in FIGS. 3 to 7 may be used.

Figure 9:
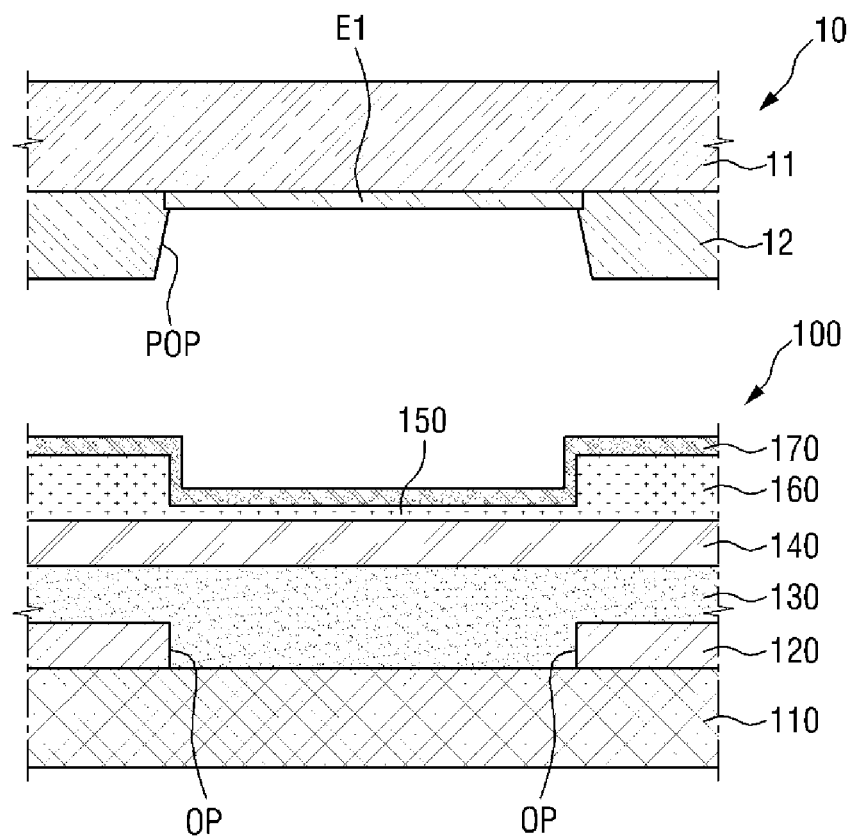

Then, referring to FIG. 9, a substrate 11 of an organic light emitting display device 10 is arranged on an upper portion of the optical patterning mask 100 so that the transfer layer 170 of the optical patterning mask 100 faces the display device, for example, a first electrode E1 of the substrate 11 of the organic light emitting display device 10. The transfer layer 170 of the optical patterning mask 100 includes, for example, an organic material. The first electrode E1 is exposed through an opening POP of a pixel-defining layer 12 that partitions respective pixels on the substrate 11.

Figure 10:
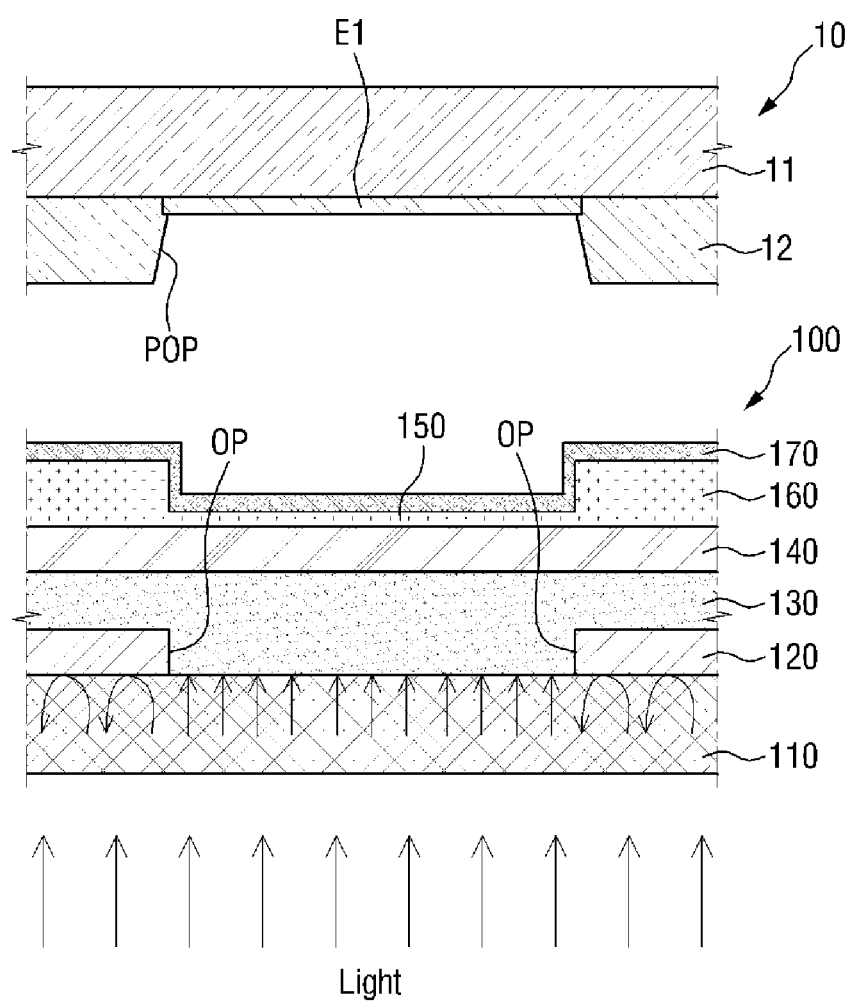

Then, referring to FIG. 10, an organic material layer, for example, a light emitting layer EML, is formed by transferring a transfer material of the transfer layer 170, which is positioned on the light absorption layer 140 and the protection layer 150 that overlaps the opening OP of the reflective layer 120, onto the first electrode E1 of the first substrate 11 of the organic light emitting display device 10 through irradiation of light from a lower portion of the base substrate 110. Here, the transfer layer 170 may include an organic light emitting layer (EML) of the organic light emitting display device.

Specifically, the light that is irradiated from the lower portion of the base substrate 110 penetrates the base substrate 110 and the thermal insulation layer 130 through the opening of the reflective layer 120, and then is absorbed in the light absorption layer 140. A reflective region of the reflective layer 120 except for the opening OP reflects the light that penetrates the base substrate 110 in the direction of the base substrate 110. The light that is absorbed in the light absorption layer 140 is converted into heat, and the heat is transferred to the transfer layer 170 through the protection layer 150. Accordingly, the organic light emitting layer of the transfer layer 170 is sublimed and deposited on the first electrode E1 of the first substrate 11 of the organic light emitting display device 10. As a result, the light emitting layer EML is formed on the first electrode E1 of the first substrate 11 of the organic light emitting display device as shown in FIG. 11.

Figure 12:
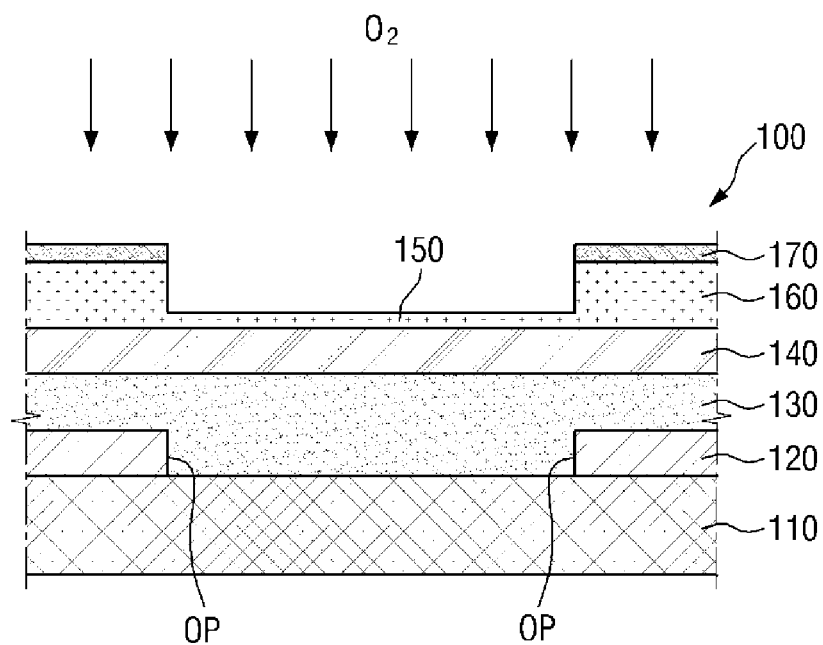
Figure 13:
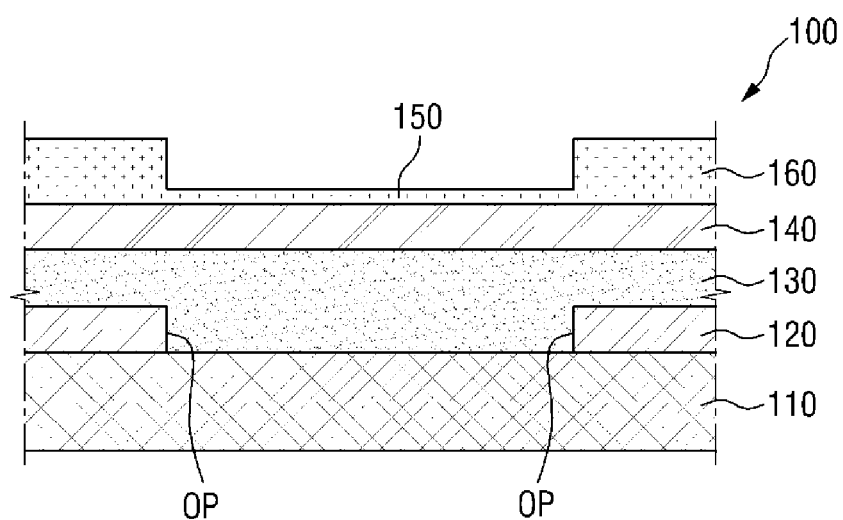

Then, referring to FIG. 12, the transfer material of the transfer layer 170 that remains on the bank layer 160 is removed by injecting $O_2$ gas energy into the upper portion of the bank layer 160 after the light emitting layer EML is formed. In this case, the protection layer 150 can protect the light absorption layer 150 from the $O_2$ gas energy. As illustrated in FIG. 13, the optical patterning mask 100, from which the transfer material of the transfer layer 170 that remains on the upper portion of the bank layer 160 has been removed, can be reused.

Figure 11:
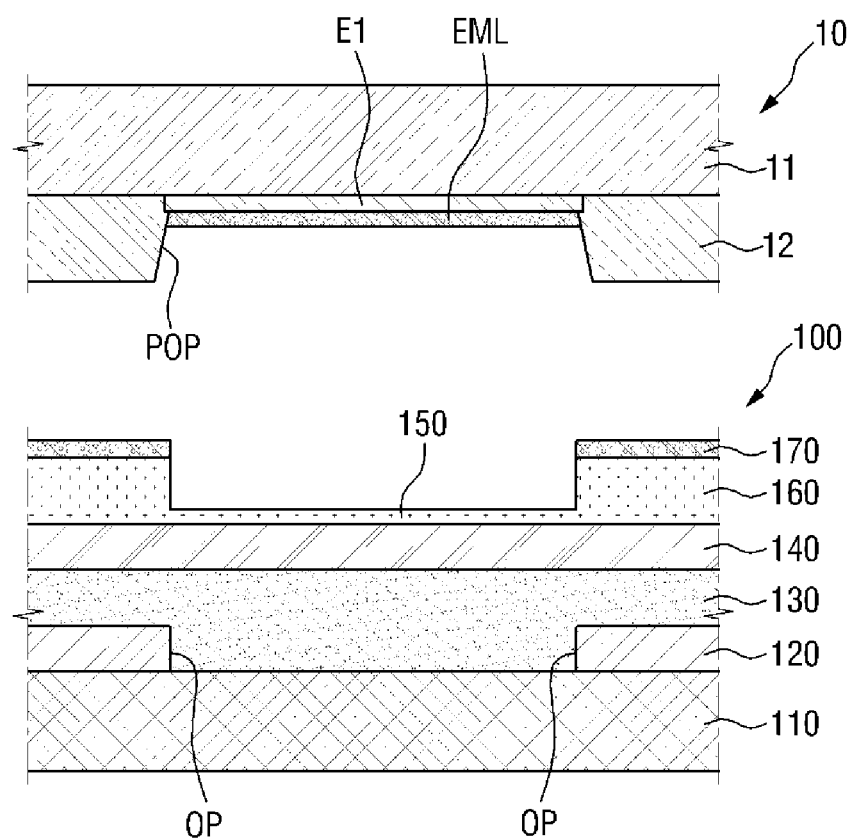

On the other hand, FIG. 11 illustrates that the light emitting layer EML is formed on the first electrode E1 of the first substrate 11 of the organic light emitting display device 10 using the optical patterning mask 100. However, any one of a hole injection layer (HIL in FIG. 14), a hole transport layer (HTL in FIG. 14), an electron injection layer (EIL), and an electron transport layer (ETL) may also be formed. In this case, the transfer layer 170 may include at least one selected from the group including an organic hole injection layer (HIL), an organic hole transport layer (HTL), an organic electron injection layer (EIL), and an organic electron transport layer (ETL).

Hereinafter, the structure of a display device, for example, an organic light emitting display device 100, which is fabricated using the optical patterning mask, will be described in detail.

Figure 14:
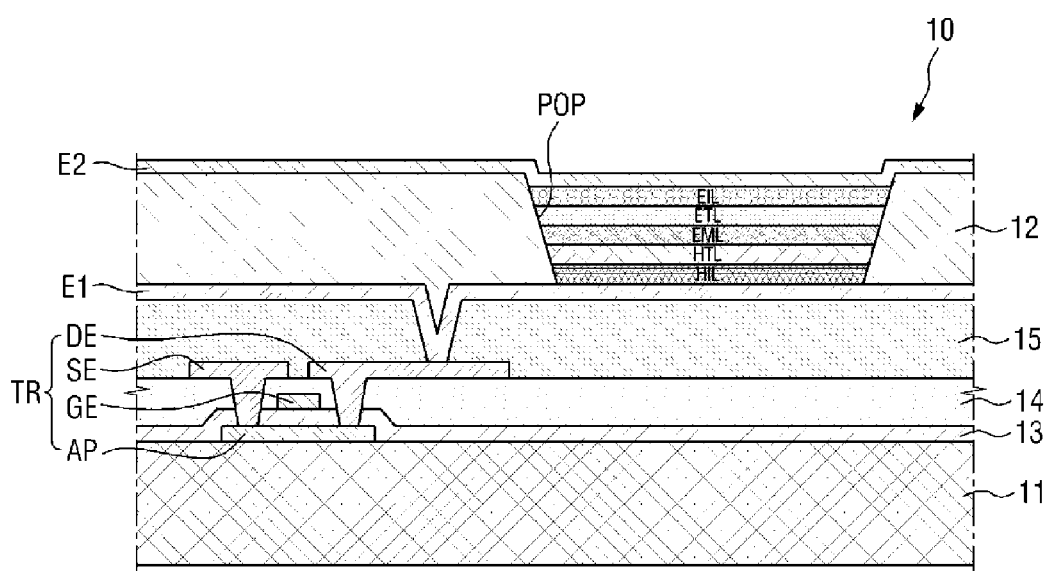
FIG. 14 is a cross-sectional view of an organic light emitting display device that is formed by the fabricating method illustrated in FIGS. 8 through 13.

FIG. 14 is a cross-sectional view of an organic light emitting display device that is formed by the fabricating method illustrated in FIGS. 8 through 13.

Referring to FIG. 14, an organic light emitting display device 10 includes a substrate 11, a semiconductor layer AP, a gate electrode GE, a source electrode SE, a drain electrode DE, a gate insulating layer 13, an interlayer insulating layer 14, a planarization layer 15, a pixel-defining layer 12, a first electrode E1, a hole injection layer HIL, a hole transport layer HTL, a light emitting layer EML, an electron transport layer ETL, an electron injection layer EIL, and a second electrode E2.

The substrate 11 may be formed of a transparent insulating material. For example, the substrate 11 may be formed of glass, quartz, ceramic, or plastic. The substrate 11 may be in a flat plate shape. In some embodiments, the substrate 11 may be formed of a material that is easily bendable. The substrate 11 may support other constructions arranged on the substrate 11.

The semiconductor layer AP may be arranged on the upper portion of the substrate 11. The semiconductor layer AP may be formed of an amorphous silicon layer or a polycrystalline silicon layer. The semiconductor layer AP may include a channel region that is not doped with an impurity, and a source region and a drain region which are arranged on both sides of the channel region to be p+-doped, and come in contact with the source electrode SE and the drain electrode DE, respectively. The impurity doped in the semiconductor layer AP may be a P-type impurity including boron (B), and for example, $B_2H_6$ may be used as the impurity. Various kinds of impurities may be doped in the semiconductor layer AP according to embodiments.

The gate insulating layer 13 may be arranged on the upper portion of the semiconductor layer AP. The gate insulating layer 13 may insulate the gate electrode GE and the semiconductor layer AP from each other. The gate insulating layer 13 may be formed of silicon nitride ($SiN_x$) or silicon oxide ($SiO_2$).

The gate electrode GE may be arranged on the gate insulating layer 13 to overlap at least a part of the semiconductor layer AP. By applying a voltage to the gate electrode GE, it can be controlled whether the semiconductor layer AP is conductive or non-conductive. For example, if a relatively high voltage is applied to the gate electrode GE, the semiconductor layer AP has conductivity and makes the drain electrode DE and the source electrode SE electrically connected to each other. If a relatively low voltage is applied to the gate electrode GE, the semiconductor layer AP has non-conductivity, and makes the drain electrode DE and the source electrode SE insulated from each other.

The interlayer insulating layer 14 may be arranged on the upper portion of the gate electrode GE. The interlayer insulating layer 14 may cover the gate electrode GE to insulate the gate electrode GE from the source electrode SE and the drain electrode. The interlayer insulating layer 14 may be formed of silicon nitride ($SiN_x$) or silicon oxide ($SiO_2$).

The source electrode SE and the drain electrode DE may be arranged on the upper portion of the interlayer insulating layer 14. The source electrode SE and the drain electrode DE may be connected to the semiconductor layer AP by through-holes formed to penetrate the interlayer insulating layer 14 and the gate insulating layer 13.

The source electrode SE, the drain electrode DE, the gate electrode GE, and the semiconductor layer AP may form a thin film transistor TR, and the thin film transistor TR may determine whether to transfer a signal that is transferred to the source electrode SE to the drain electrode DE according to the voltage applied to the gate electrode GE.

The planarization layer 15 may be formed on upper portions of the interlayer insulating layer 14, the source electrode SE, and the drain electrode DE. In order to heighten the light emitting efficiency of the light emitting layer EML that is arranged on the planarization layer 15, the planarization layer 15 may form a flat surface by eliminating a step height of the upper portions of the source electrode SE and the drain electrode DE.

The planarization layer 15 may be formed of at least one of polyacrylates resin, epoxy resin, phenolicresin, polyamides resin, polyimides resin, unsaturated polyesters resin, poly phenylenethers resin, poly phenylenesuffides resin, and benzocyclobutene (BCB).

A via hole may be formed on the planarization layer 15, and through the via hole, the first electrode E1 comes in contact with the drain electrode DE to be electrically connected thereto.

The first electrode E1 may be arranged on the upper portion of the planarization layer 15 and the lower portion of the light emitting layer EML. The first electrode E1 may be electrically connected to the drain electrode DE through the via hole to transfer the signal that is applied to the drain electrode DE to the lower portion of the light emitting layer EML.

The first electrode E1 may be formed of a reflection type conductive material, a transparent conductive material, or a semi-transparent conductive material. For example, the reflection type conductive material may be lithium (Li), calcium (Ca), lithium fluoride/calcium (LiF/Ca), lithium fluoride/aluminum (LiF/Al), aluminum (Al), silver (Ag), magnesium (Mg), or gold (Au), and the transparent conductive material may be ITO (Indium Tin Oxide), IZO (Indium Zinc Oxide), ZnO (Zinc Oxide), or $In_2O_3$ (Indium Oxide). The semi-transparent conductive material may be a co-deposition material including at least one of magnesium (Mg) and silver (Ag), or at least one material of magnesium (Mg), silver (Ag), calcium (Ca), lithium (Li), and aluminum (Al).

The pixel-defining layer 12 may be arranged on the upper portion of the planarization layer 15. The pixel-defining layer 12 may partition a plurality of pixels included in the organic light emitting display device 10, and may include an opening POP. The first electrode E1 may be exposed to the upper portion of the pixel-defining layer 12 through the opening POP. On the upper portion of the first electrode E1 in the opening POP, a hole injection layer (HIL), a hole transport layer (HTL), a light emitting layer (EML), an electron transport layer (ETL), and an electron injection layer (EIL) may be arranged.

The hole injection layer (HIL) may be formed on the first electrode EL that is exposed through the opening POP of the pixel-defining layer 12 to cover the whole pixel-defining layer 12. The hole injection layer (HIL) is a buffer layer that lowers a energy barrier between the first electrode E1 and the hole transport layer (HTL), and serves to make holes that are provided from the first electrode E1 easily injected into the hole transport layer (HTL). The hole injection layer 130 may be made of an organic compound, for example, MTDATA(4,4',4"-tris(3-methylphenylphenylamino)triphenylamine), CuPc(copper phthalocyanine) or PEDOT/PSS (poly(3,4-ethylenedioxythiphene, polystyrene sulfonate), but is not limited thereto.

The hole transport layer (HTL) is formed on the hole injection layer (HIL). The hole transport layer (HTL) serves to transfer the holes that are provided through the hole injection layer (HIL) to the light emitting layer (EML). The hole transport layer (HTL) may be made of an organic compound, for example, TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine), but is not limited thereto.

The light emitting layer EML is formed on the hole transport layer HTL. The light emitting layer EML recombine the holes provided from the first electrode E1 and the electrons provided from the second electrode E2 to emit light. More specifically, if the holes and electrons are provided to the light emitting layer EML, the holes and the electrons are combined to form excitons, and as the excitons change from an excited state to a ground state, the light emitting layer EML emits light. The light emitting layer EML may include a red light emitting layer that emits red light, a green light emitting layer that emits green light, and a blue light emitting layer that emits blue light.

The electron transport layer (ETL) is formed on the light emitting layer EML, and serves to transfer the electrons provided from the second electrode E2 to the light emitting layer (EML). The electron transport layer (ETL) may be made of an organic compound, for example, a material of Bphen(4,7-diphenyl-1,10-phenanthroline)), BAlq, Alq3 (Tris(8-quinolinorate)aluminum), $Bebq_2$(berylliumbis(benzoquinolin-10-olate), or TPBI, but is not limited thereto.

The electron injection layer (EIL) is formed on the electron transport layer (ETL), and serves to make the electrons provided from the second electrode E2 easily injected into the electron transport layer (ETL) as a buffer layer that lowers an energy barrier between the electron transport layer (ETL) and the second electrode E2. The electron injection layer (EIL) may be formed of, for example, LiF or CsF, but is not limited thereto.

The second electrode E2 may be arranged on the upper portion of the electron injection layer (EIL). The second electrode E2 may be formed of the same material as the material of the first electrode E1, but is not limited thereto. In some embodiments, the second electrode E2 may be a common electrode that is arranged on a plurality of pixels included in the organic light emitting display device. In some embodiments, the second electrode E2 may be arranged on front surfaces of the upper portion of the electron injection layer (EIL) and the upper portion of the pixel-defining layer 12. Light emission of the light emitting layer (EML) may be controlled according to current that flows between the first electrode E1 and the second electrode E2.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:
1. An optical patterning mask, comprising:
a base substrate;
a reflective layer disposed on the base substrate and including an opening;

a thermal insulation layer disposed on the reflective layer to cover the opening;

a light absorption layer disposed on the thermal insulation layer;

a tapered layer arranged between the thermal insulation layer and the light absorption layer;

a protection layer disposed on the light absorption layer to overlap the opening;

a bank layer disposed on the light absorption layer to expose the protection layer; and a transfer layer disposed on the protection layer and the bank layer, wherein the protection layer is thinner than the bank layer, wherein the transfer layer comprises a transfer inclination portion having an inclination in a portion that overlaps an edge of the opening, and wherein the tapered layer includes a tapered inclination portion formed to expose a portion of the thermal insulation layer overlapping the opening.

2. The optical patterning mask of claim 1, wherein the protection layer and the bank layer are integrally formed.

3. The optical patterning mask of claim 1, wherein the protection layer and the bank layer are formed of same material.

4. The optical patterning mask of claim 1, wherein the bank layer and the protection layer are formed of an inorganic material.

5. The optical patterning mask of claim 1, wherein a portion of the transfer layer that overlaps the opening is flat.

6. The optical patterning mask of claim 1, wherein the thermal insulation layer comprises a groove formed in a region overlapping the opening.

7. An optical patterning mask comprising:
a base substrate;
a reflective layer disposed on the base substrate and including an opening;
a thermal insulation layer disposed on the reflective layer to cover the opening;
a light absorption layer disposed on the thermal insulation layer;
a protection layer disposed on the light absorption layer;
a bank layer disposed on the protection layer so that a portion of the protection layer that overlaps the opening is exposed; and
a transfer layer disposed on a region of the protection layer that overlaps the opening and the bank layer,
wherein the protection layer is thinner than the bank layer, and
wherein the protection layer and the bank layer are formed of different materials.

8. The optical patterning mask of claim 7, wherein the protection layer and the bank layer have different etching rates.

9. The optical patterning mask of claim 7, wherein the bank layer and the protection layer are formed of an inorganic material.

10. The optical patterning mask of claim 7, wherein a region of the transfer layer that overlaps the opening is flat.

11. The optical patterning mask of claim 7, wherein the transfer layer comprises a transfer inclination portion having an inclination in a portion that overlaps an edge of the opening.

12. The optical patterning mask of claim 11, wherein the thermal insulation layer comprises a groove formed in a region overlapping the opening.

13. The optical patterning mask of claim 11, further comprising:
a tapered layer arranged between the thermal insulation layer and the light absorption layer,
wherein the tapered layer includes a tapered inclination portion formed to expose a portion of the thermal insulation layer overlapping the opening.

14. A method for fabricating a display device, comprising:
preparing an optical patterning mask comprising a base substrate, a reflective layer formed on the base substrate and including an opening, a thermal insulation layer formed on the reflective layer to cover the opening, a light absorption layer formed on the thermal insulation layer, a protection layer formed to overlap the opening, a bank layer formed on the light absorption layer to expose the protection layer, and a transfer layer formed on the protection layer and the bank layer; arranging a substrate over an upper portion of the optical patterning mask so that the transfer layer faces a first electrode of a substrate of the display device; forming a material layer on the substrate by transferring a transfer material of the transfer layer disposed on the protection layer and the light absorption layer overlapping the opening by irradiating a lower portion of the optical patterning mask with light; and removing the transfer material of the transfer layer that remains,
wherein the bank layer and the protection layer have different etching rates.

15. The method of claim 14, wherein the transfer layer is at least one of a light emitting layer, a hole injection layer, a hole transport layer, an electron injection layer, and an electron transport layer.

16. The method of claim 14, wherein removing the transfer material is performed by injecting $O_2$ gas energy.

* * * * *